(12) United States Patent
Zheng

(10) Patent No.: US 10,499,505 B2
(45) Date of Patent: Dec. 3, 2019

(54) ELECTRICAL CONDUCTIVE MODULE

(71) Applicant: Molex, LLC, Lisle, IL (US)

(72) Inventor: You-Xiang Zheng, Pudong (CN)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 16/127,419

(22) Filed: Sep. 11, 2018

(65) Prior Publication Data

US 2019/0082533 A1 Mar. 14, 2019

(30) Foreign Application Priority Data

Sep. 13, 2017 (CN) .................... 2017 2 1173358 U

(51) Int. Cl.

| H05K 7/10 | (2006.01) |
|---|---|
| H05K 7/12 | (2006.01) |
| H05K 1/11 | (2006.01) |
| H01R 12/70 | (2011.01) |
| H05K 3/36 | (2006.01) |
| H05K 3/40 | (2006.01) |
| H01R 12/52 | (2011.01) |

(52) U.S. Cl.
CPC ........... *H05K 1/113* (2013.01); *H01R 12/523* (2013.01); *H01R 12/7005* (2013.01); *H05K 1/116* (2013.01); *H05K 3/363* (2013.01); *H05K 3/4015* (2013.01); *H05K 2201/10371* (2013.01)

(58) Field of Classification Search
USPC ....................................................... 361/808
See application file for complete search history.

(56) References Cited

U.S. PATENT DOCUMENTS

| 5,484,964 A * | 1/1996 | Dawson ............ H01L 23/49811 |
|---|---|---|
| | | 174/260 |
| 6,079,987 A * | 6/2000 | Matsunaga .......... G01R 1/0416 |
| | | 439/66 |
| 6,312,266 B1 | 11/2001 | Fan et al. |
| 6,392,899 B1 * | 5/2002 | Harrison ................ G06F 1/189 |
| | | 248/610 |

(Continued)

FOREIGN PATENT DOCUMENTS

| CN | 01802042 C | 12/2005 |
|---|---|---|
| CN | 102480838 A | 5/2012 |

*Primary Examiner* — Hung S. Bui
(74) *Attorney, Agent, or Firm* — Molex, LLC

(57) ABSTRACT

An electrical conductive module comprises: a circuit board, which has an upper side and a lower side opposite to each other in an up-down direction, the upper side of the circuit board is provided with a plurality of upper side pads, the lower side of the circuit board is provided with a plurality of lower side pads, the lower side pads and the upper side pads are provided in pairs, the lower side pad and the upper side pad in each pair are electrically connected together via a connecting through hole and printed wires which are provided alongside; the circuit board is provided with a plurality of conducting through holes for interposing the lower side pads and the upper side pads in different pairs; and a plurality of conducting posts, which each have a soldering end and a mating end opposite to each other in the up-down direction, the soldering end is soldered to the upper side pad on the circuit board correspondingly. The present disclosure can simplify structure and reduce production cost.

11 Claims, 5 Drawing Sheets

(56) References Cited

U.S. PATENT DOCUMENTS

| | | | |
|---|---|---|---|
| 6,660,946 B2 * | 12/2003 | Saiki | B23K 1/20 |
| | | | 174/261 |
| 7,393,217 B2 | 7/2008 | Huang et al. | |
| 9,137,903 B2 * | 9/2015 | Kang | H01L 23/562 |
| 9,439,333 B2 * | 9/2016 | Daughtry, Jr. | H05K 9/0028 |
| 9,485,880 B2 * | 11/2016 | Jeong | H05K 5/0047 |
| 9,842,745 B2 * | 12/2017 | Mohammed | H01L 23/142 |

* cited by examiner

ELECTRICAL CONDUCTIVE MODULE

RELATED APPLICATIONS

This application claims priority to Chinese Application No. 201721173358.X, filed Sep. 13, 2017, which is incorporated herein by reference in its entirety.

TECHNICAL FIELD

The present disclosure relates to an electrical conductive module, especially relates to an electrical conductive module for connecting a motherboard of an electronic device with an external circuit.

BACKGROUND ART

An electronic device such as a mobile phone can be provided with an electrical conductive module on a motherboard thereof, the electrical conductive module is exposed to an outer case, and can be connected to an external circuit (such as a plug connector) to transmit power or signals.

Chinese patent application No. CN01802042.9 discloses a carrier for a Land Grid Array connector, which comprises: a) a substrate having at least one upper section, at least one lower section and at least one adhesive section located intermediate the upper section and the lower section; b) the substrate has a plurality of openings, each of the openings is used to accept a contact member; and c) at least one contact member; the adhesive section contact at least a portion of the contact member and provides retention for the contact member. Such a substrate needs to have a three-layer structure comprising the adhesive section, which has a complicated structure and high production cost.

SUMMARY

A technical problem to be solved by the present disclosure is to provide an electrical conductive module which can simplify structure and reduce production cost so as to overcome the deficiency in the prior art as described above.

In view of the above technical problem, the present disclosure provides an electrical conductive module comprising: a circuit board, which has an upper side and a lower side opposite to each other in an up-down direction, the upper side of the circuit board is provided with a plurality of upper side pads, the lower side of the circuit board is provided with a plurality of lower side pads, the lower side pads and the upper side pads are provided in pairs, the lower side pad and the upper side pad in each pair are electrically connected together via a connecting through hole and printed wires which are provided alongside; the circuit board is provided with a plurality of conducting through holes for interposing the lower side pads and the upper side pads in different pairs; and a plurality of conducting posts, which each have a soldering end and a mating end opposite to each other in the up-down direction, the soldering end is soldered to the upper side pad on the circuit board correspondingly.

Compared with the prior art, the electrical conductive module of the present disclosure connects the upper side pad with the lower side pad of the circuit board via the connecting through hole and the printed wires, and then the conducting post is directly soldered to the upper side pad, thereby achieving a purpose of conducting between the upper side and lower side to avoid using the substrate having the adhesive section in the prior art, which simplifies the product structure and reduces the product cost; and additionally, a plurality of conducting through holes are interposed between different pairs of the lower side pads and the upper side pads, which can reduce crosstalk.

DETAILED DESCRIPTION OF THE PREFERRED EMBODIMENTS

While the present disclosure may be susceptible to embodiments in different forms, there are shown in the figures, and will be described herein in detail, are only specific embodiments, with the understanding that the present disclosure is to be considered as an exemplification of the principles of the present disclosure, and is not intended to limit the present disclosure to that as illustrated.

As such, references to a feature are intended to describe a feature of an example of the present disclosure, not to imply that every embodiment thereof must have the described feature. Furthermore, it should be noted that the description illustrates a number of features. While certain features have been combined together to illustrate potential system designs, those features may also be used in other combinations not expressly disclosed. Thus, the depicted combinations are not intended to be limiting, unless otherwise noted.

In the embodiments illustrated in the figures, representations of directions such as up, down, left, right, upper and rear, used for explaining the structure and movement of the various parts of the present disclosure, are not absolute, but relative. These representations are appropriate when the parts are in the position shown in the figures. If the description of the position of the parts changes, these representations are to be changed accordingly.

Hereinafter an embodiment of the present discourse will be further described in detail in combination with the figures.

Figure 1:
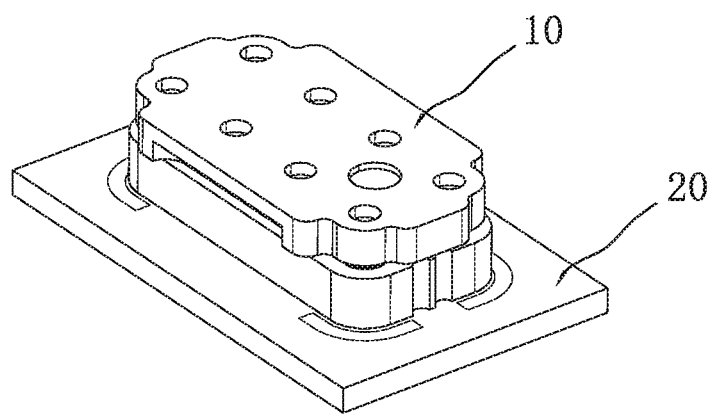
FIG. 1 is an assembled perspective view of an embodiment of an electrical conductive module in the present disclosure and a motherboard.
Figure 2:
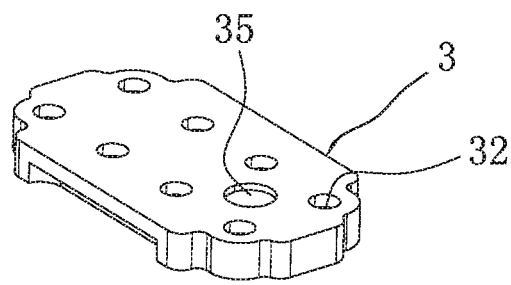
FIG. 2 is an assembled perspective view of the embodiment of the electrical conductive module in the present disclosure and the motherboard, in which a protecting cover of the electrical conductive module is in a state that the protecting cover is opened.
Figure 2:
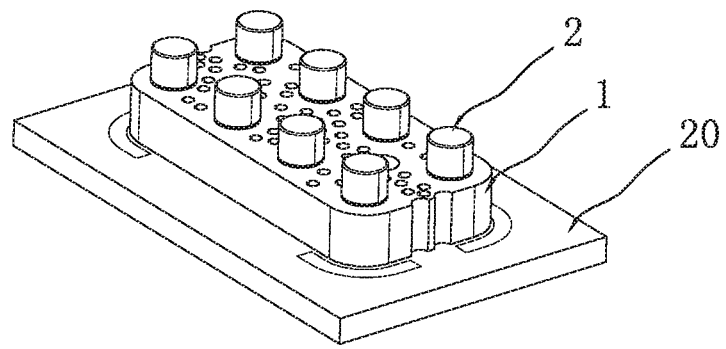
Figure 3:
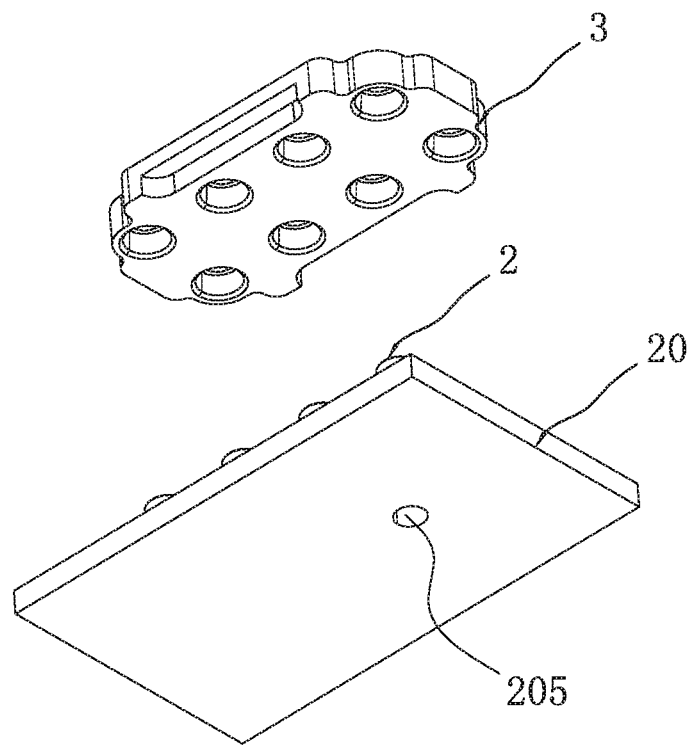
FIG. 3 is an assembled perspective view of the embodiment of the electrical conductive module in the present disclosure and the motherboard from another angle, in which the protecting cover of the electrical conductive module is in a state that the protecting cover is opened.
Figure 4:
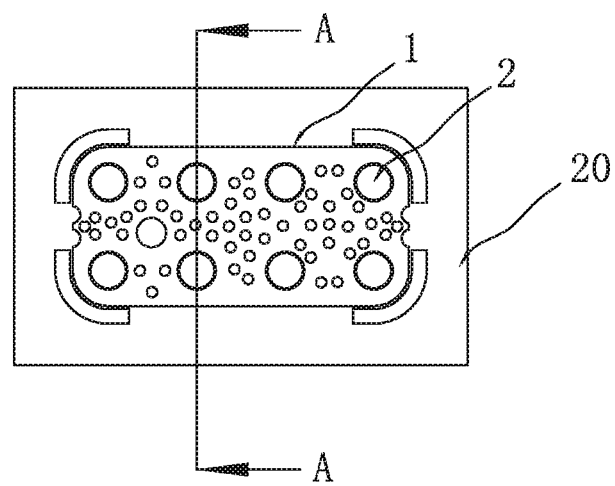
FIG. 4 is a top view of the embodiment of the electrical conductive module in the present disclosure and the motherboard, in which the protecting cover of the electrical conductive module is removed.
Figure 5:
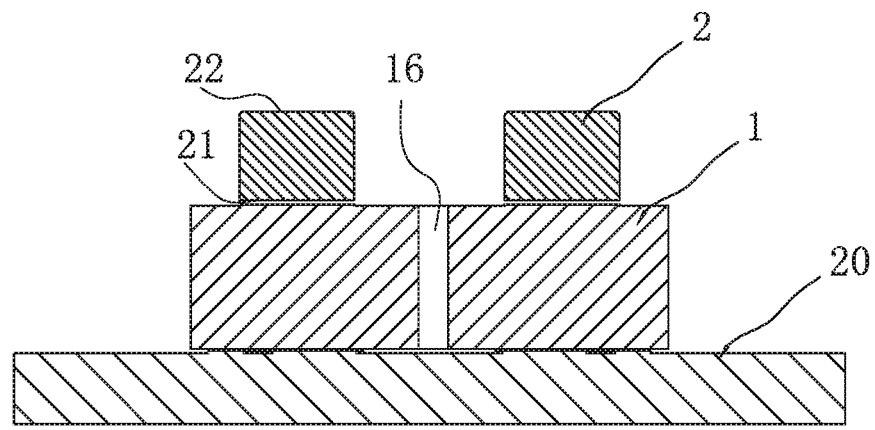
FIG. 5 is a cross-sectional view taken along a line A-A in FIG. 4.
Figure 6:
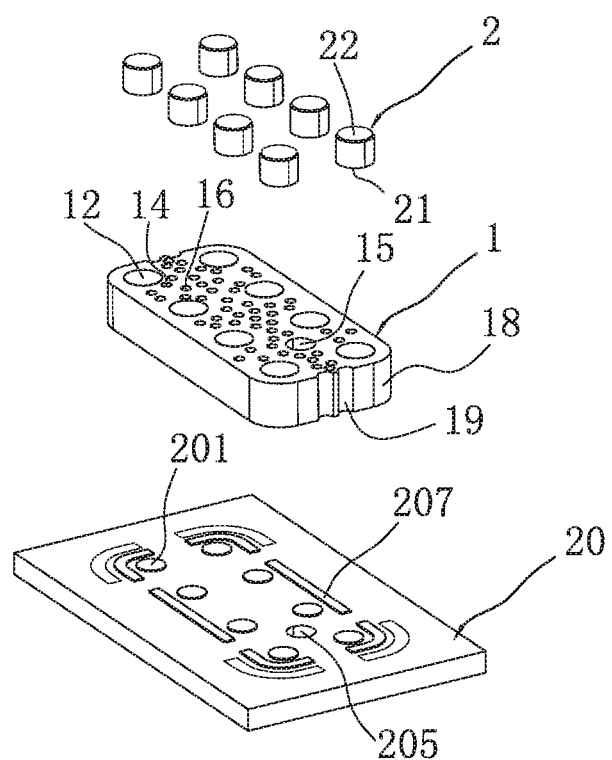
FIG. 6 is an exploded perspective view of the embodiment of the electrical conductive module in the present disclosure after the protecting cover is removed.
Figure 7:
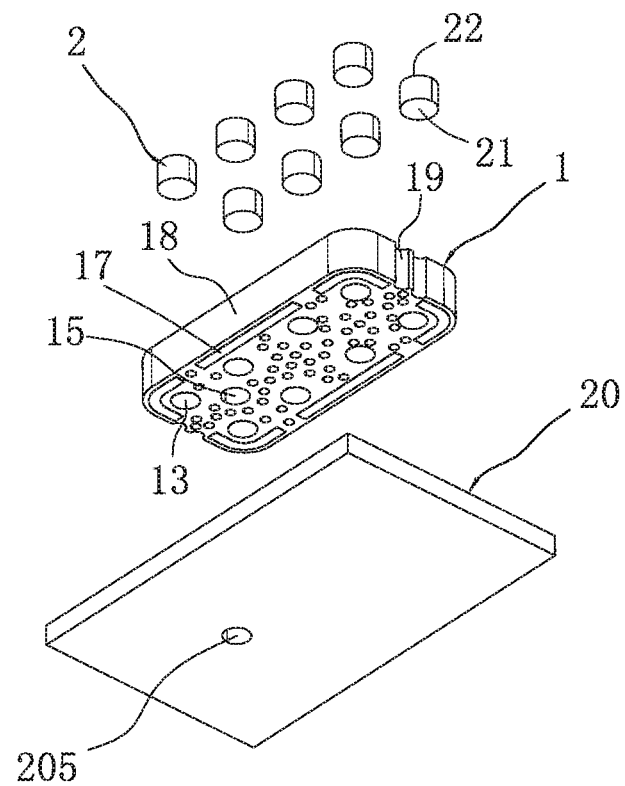
FIG. 7 is an exploded perspective view of the embodiment of the electrical conductive module in the present disclosure from another angle after the protecting cover is removed.

Referring to FIG. 1 to FIG. 3, the present disclosure provides an electrical conductive module 10 which comprises: a circuit board 1 and eight conducting posts 2 soldered to an upper surface of the circuit board 1 and a protecting cover 3 covering over the conducting posts 2.

The conducting post 2 is preferably fixed to the upper surface of the circuit board 1 by a surface welding. The conducting post 2 is preferably a cylindrical metal post. In the embodiment, the eight conducting posts 2 have same size and structure. For example, a height of the conducting post 2 is 1.5 mm. The conducting post 2 has a soldering end 21 and a mating end 22 opposite to the soldering end 21 in an up-down direction, and the conducting post 2 can be connected with an external circuit (such as a plug connector, and not shown in figures) via the mating end 22.

The protecting cover 3 is sheathed over the circuit board 1, the protecting cover 3 is provided with a plurality of accommodating holes 32 for accommodating the conducting posts 2 correspondingly. The protecting cover 3 is provided with an aligning hole 35. When used, the protecting cover 3 would be removed.

The electrical conductive module 10 can be adapted to an electronic device such as a mobile phone for connecting a motherboard (motherboard) 20 of the electronic device to the external circuit. Specifically, the electrical conductive module 10 is soldered on the motherboard 20, and the conducting post 2 is exposed outwardly from an outer case of the electronic device so as to be connected with the external circuit correspondingly for charging or transmitting a signal.

The motherboard 20 is provided with eight surface pads 201 to electrically connect with the conducting posts 2 correspondingly and a plurality of fixing pads 207 to strengthen fixing of the circuit board 1. The motherboard 20 is provided with an aligning hole 205.

Referring to FIG. 4 to FIG. 7, the circuit board 1 is a double-sided plate, an upper side of the circuit board 1 is provided with eight upper side pads 12 to be correspondingly soldered to the eight conducting posts 2. A lower side of the circuit board 1 is provided with eight lower side pads 13 and a plurality of board side pads 17 to be correspondingly soldered to the surface pads 201 and the fixing pads 207 of the motherboard 20. The eight lower side pads 13 and the eight upper side pads 12 correspond to each other in one-to-one, and are provided in pairs, such that the eight conducting posts 2 can be electrically connected with circuits (not shown in figures) on the motherboard 20 via the circuit board 1.

Figure 8:
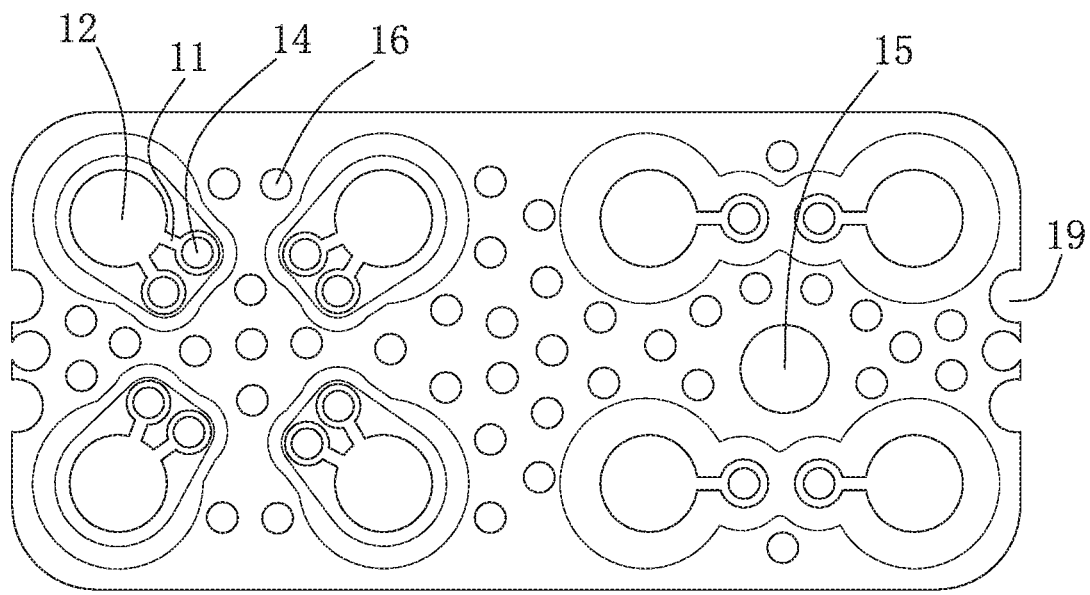
FIG. 8 is a layout of an upper side wire of a circuit board in the embodiment of the electrical conductive module in the present disclosure.
Figure 9:
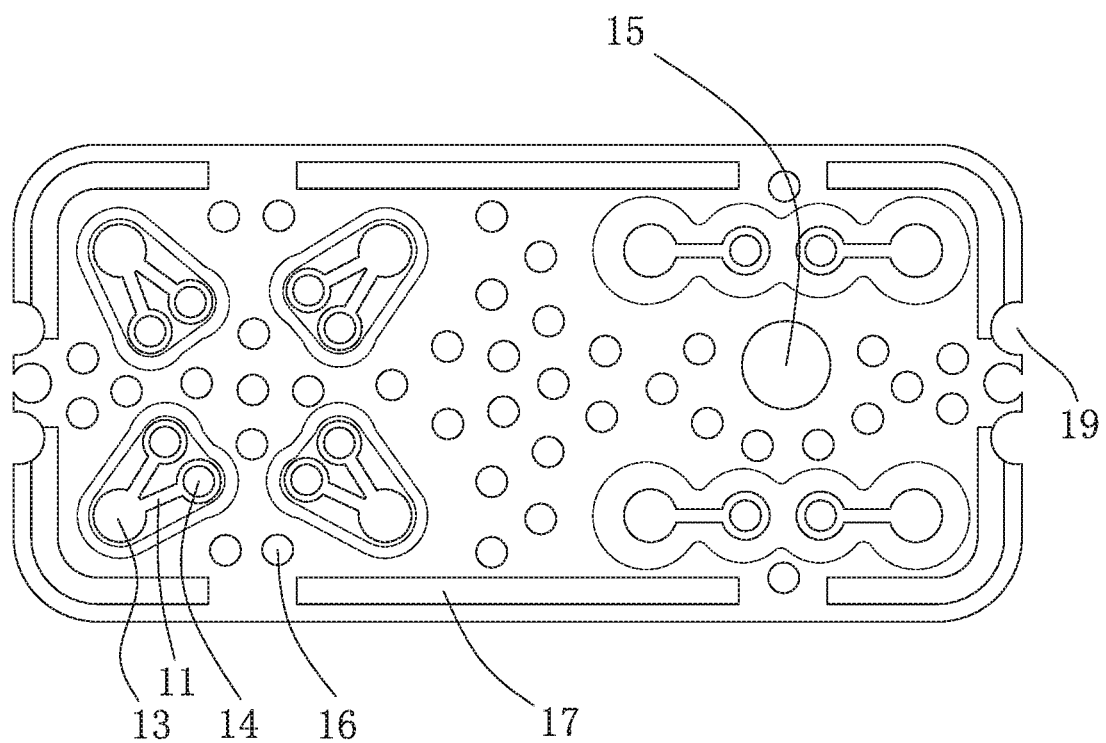
FIG. 9 is a layout of a lower side wire of the circuit board in the embodiment of the electrical conductive module in the present disclosure.

Referring to FIG. 8 and FIG. 9, in the embodiment, both the upper side pad 12 and the lower side pad 13 are round pads, and the upper side pad 12 has a larger size (larger radius, larger area). A center of the upper side pad 12 and a center of the lower side pad 13 in each pair are on a same vertical line in an up-down direction.

Referring to FIG. 8 and FIG. 9, one or two electrically conductive connecting through holes 14 are provided alongside the upper side pad 12 and the lower side pad 13 in each pair correspondingly. The upper side pad 12 and the lower side pad 13 in each pair each are connected with the connecting through hole 14 via printed wires 11. The connecting through hole 14 preferably penetrates the circuit board 1 in the up-down direction, and a metal conducting layer is formed on an inner surface of the connecting through hole 14 by an immersion gold process, thus the upper side pad 12 and the lower side pad 13 in each pair can be electrically connected together via the printed wire 11 on the upper side (referring to FIG. 8, and the printed wire is not shown in FIG. 4 to FIG. 7 for omission), the connecting through hole 14 and the printed wire 11 on the lower side (referring to FIG. 9, and the printed wire is not shown in FIG. 4 to FIG. 7 for omission). The design that an electrical connection is realized by the connecting through hole 14 provided alongside the upper side pad 12 and the lower side pad 13 is beneficial to enhance a engagement strength between the conducting post 2 and the upper side pad 12. The lower side pads 13 are correspondingly soldered to the surface pads 201 on the motherboard 20, thereby realizing an electrical connection between the conducting post 2 and the surface pad 201.

Referring to FIG. 8 to FIG. 9, a plurality of conducting through holes 16 are provided alongside the upper side pad 12 and the lower side pad 13 in each pair. The conducting through hole 16 is similar to the connecting through hole 14, and is provided on the circuit board 1 by penetrating in the up-down direction, and a metal conducting layer is formed on an inner surface of the conducting through hole 16 by the immersion gold process, the conducting through holes 16 are interposed between the upper side pads 12 and the lower side pads 13 in pairs so as to reduce crosstalk.

It is worth mentioning that the connecting through holes 14/16 can be formed by a process such as a gold plating and a wave soldering process in addition to the immersion gold process, as long as a purpose of conducting the connecting through hole 14/the conducting through hole 16 in the up-down direction can be achieved.

Also, an outer side face 18 of the circuit board 1 is also preferably formed with a metal shielding layer by the immersion gold process so as to prevent the electromagnetic radiation from leaking out.

It can be understand that the conducting through holes 16 together with the outer side face 18 having the metal shielding layer can enhance the ability of the electrical conductive module 10 resisting to an electromagnetic interference (EMI for abbreviation), so that a signal transmitted by the electrical conductive module 10 is not interfered.

Referring to FIG. 9, the lower side of the circuit board 1 is provided with a plurality of board side pads 17 for soldering the electrical conductive module 10 to the fixing pads 207 on the motherboard 20 correspondingly to enhance an engagement strength of the electrical conductive module 10 and the motherboard 20. Preferably, the board side pads 17 are also can be used for grounding.

The circuit board 1 is provided with an aligning hole 15 penetrating in the up-down direction, the aligning hole 15 and the aligning hole 205 on the motherboard 20 are aligned in the same line when assembled, thereby avoiding a wrong assembling direction when the circuit board 1 is assembled to the motherboard 20.

The circuit board 1 is rectangle, and a notch 19 is formed on each of two short sides of the circuit board 1 for coupling a plurality of circuit boards 1 to a large circuit board to facilitate production.

Compared with the prior art, the electrical conductive module 10 of the present disclosure connects the upper side pad 12 and the lower side pad 13 in each pair via the connecting through hole 14 and the printed wires 11 provided alongside to achieve a purpose of conducting between the upper side and the lower side; and the conducting through holes 16 are interposed between the upper side pads 12 and the lower side pads 13 in different pairs, which can reduce crosstalk; also, with the conducting posts 2 with the same heights, the circuit boards 1 with different thickness can cooperate with the conducting posts 2, so as to adapt to a different height difference between the motherboard 20 and the outer case of the various electronic devices to achieve the effect of transmitting power or signals of the electronic devices with the external circuits (such as a plug connector), which has a wide applicability without modifying a metal mold of forming the conducting post 2 and also helps reduce manufacturing cost.

The above contents are only embodiments of the present disclosure and are not used to limit the implementing solution of the present disclosure, those skilled in the art may conveniently make corresponding variation or modification based on the main concept and spirit of the present disclosure, therefore the extent of protection of the present disclosure shall be determined by terms of the Claims.

What is claimed is:

1. An electrical conductive module, comprising:
a circuit board, which has an upper side and a lower side opposite to each other in an up-down direction, the circuit pad having a plurality of paired pad sets, a plurality of paired connecting through holes, a plurality of paired upper printed wires provided on the upper side of the circuit board, and a plurality of paired lower printed wires provided on the lower side of the circuit board, each pair of pad sets having an upper side pad which is provided on the upper side of the circuit board and a lower side pad which is provided on the lower side of the circuit board, each pair of connecting through holes having a first connecting through hole and a second connecting through hole, each pair of upper printed wires having a first upper printed wire and a second upper printed wire, each pair of lower printed wires having a first lower printed wire and a second lower printed wire, each pair of pad sets being operatively associated with a respective one of the pair of connecting through holes, a respective one of the pair of upper printed wires, and a respective one of the pair of lower printed wires, wherein the upper side pad is electrically connected to the first upper printed wire, which in turn is electrically connected to the first connecting through hole, which in turn is electrically connected to the first lower printed wire, which in turn is electrically connected to the lower side pad, and wherein the upper side pad is further electrically connected to the second printed wire, which in turn is electrically connected to the second connecting through hole, which in turn is electrically connected to the second lower printed wire, which in turn is electrically connected to the lower side pad; and
a plurality of conducting posts, each conducting post being associated with a respective one of the pair of pad sets, each conducting post having a soldering end and a mating end opposite to each other in the up-down direction, the soldering end being soldered to the upper side pad of the pair of pad sets.

2. The electrical conductive module according to claim 1, wherein the conducting post is a cylindrical metal post.

3. The electrical conductive module according to claim 1, wherein an outer side face of the circuit board is formed with a metal shielding layer.

4. The electrical conductive module according to claim 1, wherein each connecting through hole is provided on the circuit board by penetrating in the up-down direction, and a metal conducting layer is formed on an inner surface of each connecting through hole.

5. The electrical conductive module according to claim 1, wherein the lower side of the circuit board is further provided with a board side pad for soldering the electrical conductive module to a motherboard.

6. The electrical conductive module according to claim 1, wherein, a radius of the lower side pad is less than a radius of the upper side pad in each pair.

7. The electrical conductive module according to claim 1, wherein the circuit board is provided with an aligning hole penetrating in the up-down direction.

8. The electrical conductive module according to claim 1, wherein the circuit board is rectangle, a notch is formed on each of two short sides of the circuit board.

9. The electrical conductive module according to claim 1, wherein the electrical conductive module further comprises a protecting cover sheathed over the circuit board, the protecting cover is provided with a plurality of accommodating holes for accommodating the conducting posts correspondingly.

10. The electrical conductive module according to claim 1, wherein the circuit board is provided with a plurality of conducting through holes for interposing the lower side pads and the upper side pads in different pairs.

11. The electrical conductive module according to claim 10, wherein a metal conducting layer is formed on an inner surface of the each conducting through hole.

* * * * *